United States Patent
Chao et al.

(10) Patent No.: US 10,784,795 B1
(45) Date of Patent: Sep. 22, 2020

(54) CONVERSION CIRCUIT

(71) Applicant: DELTA ELECTRONICS, INC., Taoyuan (TW)

(72) Inventors: Wei-Hsiang Chao, Taoyuan (TW); Po-Chin Chuang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/547,561

(22) Filed: Aug. 21, 2019

(51) Int. Cl.
*H02M 1/08* (2006.01)
*H02M 7/217* (2006.01)
*H02M 1/00* (2006.01)

(52) U.S. Cl.
CPC .... *H02M 7/217* (2013.01); *H02M 2001/0009* (2013.01)

(58) Field of Classification Search
CPC .................. H02M 1/08; H02M 7/217; H02M 2001/0009; H01L 2924/00; H01L 2924/0002; H01L 2924/00014; H01L 2924/13091
See application file for complete search history.

(56) References Cited

U.S. PATENT DOCUMENTS

| 2004/0061521 A1* | 4/2004 | Watanabe ...... H03K 19/018521 326/62 |
|---|---|---|
| 2013/0301170 A1 | 11/2013 | Wagoner et al. |
| 2014/0111253 A1 | 4/2014 | Fukuta et al. |

FOREIGN PATENT DOCUMENTS

| CN | 102869148 A | 1/2013 |
| EP | 2009792 A2 | 12/2008 |
| TW | I627826 B | 6/2018 |

* cited by examiner

*Primary Examiner* — Sibin Chen
(74) *Attorney, Agent, or Firm* — CKC & Partners Co., LLC

(57) ABSTRACT

A conversion circuit includes a main device, a voltage control circuit and a trigger circuit. An output terminal of the voltage control circuit is electrically connected to a control terminal of the main device. The voltage control circuit is configured to output a driving signal having a first voltage level to the main device. The trigger circuit comprises an output terminal and a sense terminal. The output terminal of the trigger circuit is electrically connected to the control terminal of the voltage control circuit, and the sense terminal of the trigger circuit is electrically connected to the control terminal of the main device.

8 Claims, 7 Drawing Sheets

US 10,784,795 B1

CONVERSION CIRCUIT

BACKGROUND

Technical Field

The present disclosure relates to a power supply device, and in particular, to a conversion circuit in the power supply device.

Description of Related Art

For existing conversion circuit for the power converters, the supplying voltage is designed in response to the rated voltage of the semiconductor device to be driven. Therefore, one or more additional voltage regulators are required to regulate the system supplying power to meet the voltage requirement of the conversion circuit and the semiconductor device.

SUMMARY

One aspect of the present disclosure is a conversion circuit. The conversion circuit includes a main device, a voltage control circuit and a trigger circuit. The main device includes a control terminal. The voltage control circuit includes an output terminal and a control terminal. The output terminal of the voltage control circuit is electrically connected to the control terminal of the main device. The voltage control circuit is configured to output a driving signal having a first voltage level to the main device. The trigger circuit comprises an output terminal and a sense terminal. The output terminal of the trigger circuit is electrically connected to the control terminal of the voltage control circuit. The sense terminal of the trigger circuit is electrically connected to the control terminal of the main device. It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
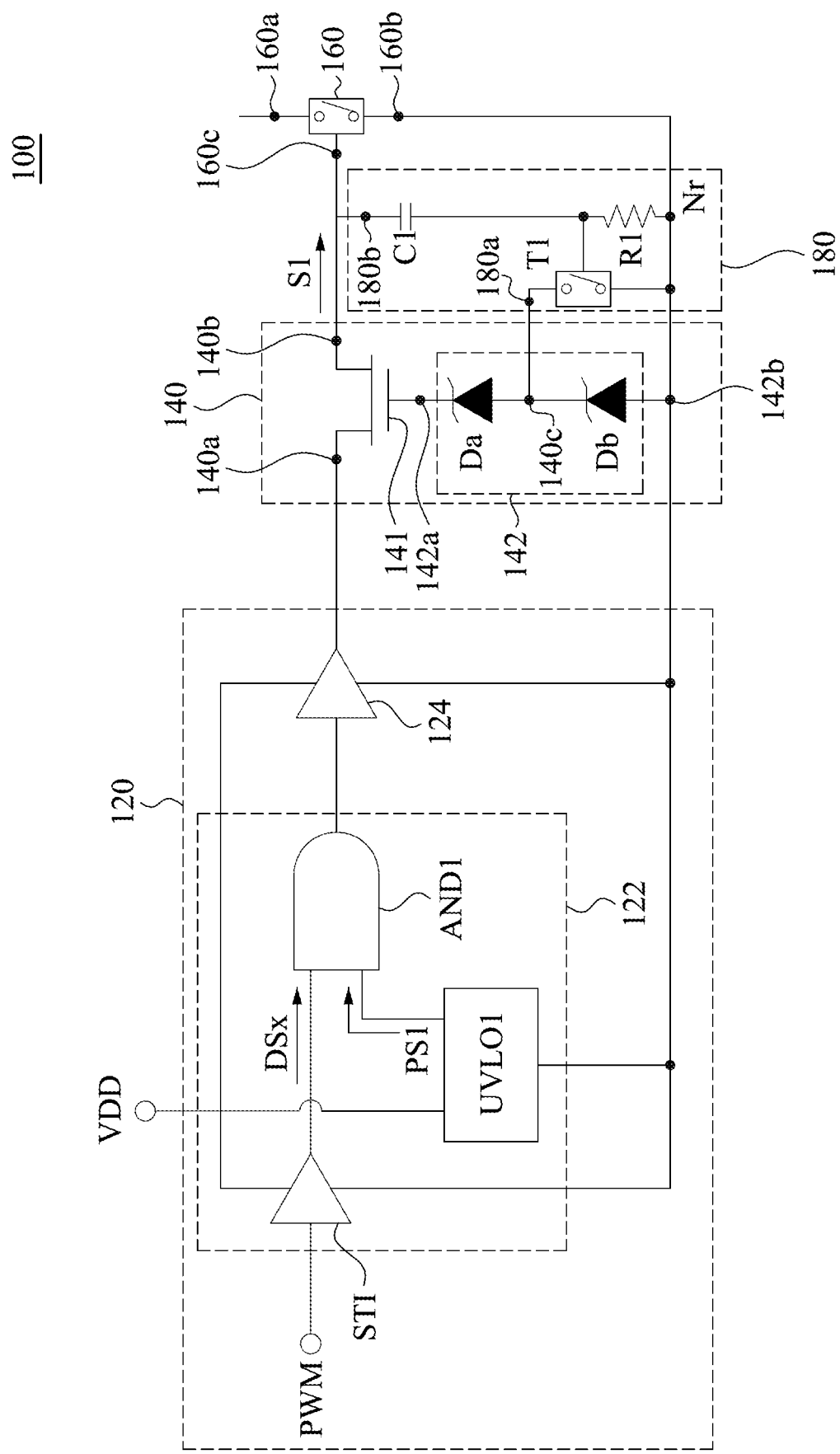
FIG. 1 is a schematic diagram of a conversion circuit in some embodiments of the present disclosure.

Reference is made to FIG. 1. FIG. 1 is a diagram illustrating a conversion circuit 100 according to some embodiments of the present disclosure. As shown in FIG. 1, the conversion circuit 100 includes a voltage control circuit 140, a main device 160 and a trigger circuit 180.

In structural, the main device 160 includes a first terminal 160a, a second terminal 160b and a control terminal 160c. The second terminal 160b is electrically connected to a reference terminal Nr. The control terminal 160c is configured to receive a driving signal S1, so that the main device 160 is driven in response to a first voltage level of the driving signal S1. The main device 160 operates in a first state (e.g., a normal working state) and is configured to perform power switching. In various embodiments of the present disclosure, the main device 160 may be the power switching element applied in various switching power supply devices, such as a buck converter, a boost converter, a buck-boost converter or any other devices having power switches. For example, the main device 160 may include a Gallium Nitride (GaN) switching device, a MOSFET switching device, an Insulated Gate Bipolar Transistor (IGBT) switching device, a bipolar junction transistor (BJT) switching device, a Silicon Carbide (SiC) switching device, a relay switching device, or any combination thereof. i The voltage control circuit 140 is electrically connected to the main device 160 so as to provide the driving signal S1 to the main device 160. In some embodiments, the voltage control circuit 140 includes an input terminal 140a, an output terminal 140b and a control terminal 140c. The output terminal 140b is electrically connected to the control terminal 160c of the main device 160. The voltage control circuit 140 is configured to receive an original signal, and output a driving signal S1 to the main device 160 according to the original signal S0.

In some embodiments, the conversion circuit 100 further includes a driving signal generator 120 to generate the original signal S0. The driving signal generator 120 is electrically connected to the input terminal 140a of the voltage control circuit 140. The driving signal generator 120 includes a logic circuit 122 and a driver buffer 124, and is configured to receive an input voltage VDD from a voltage source and generate the original signal S0. Details will be explained in the following paragraphs.

The trigger circuit 180 is configured to modify the voltage level at the control terminal 140c, so that the voltage level of the driving signal S1 (i.e., the voltage level of the control terminal 160c) is changed accordingly. For example, the voltage level of the driving signal S1 is temporarily decreased from the first voltage level to the second voltage level.

In some embodiments, the trigger circuit 180 is electrically connected between the control terminal 160c and the control terminal 140c. The trigger circuit 180 includes an output terminal 180a and a sense terminal 180b. The output terminal 180a of the trigger circuit 180 is electrically connected to the control terminal 140c of the voltage control circuit 140, and the sense terminal 180b of the trigger circuit 180 is electrically connected to the control terminal 160c of the main device 160.

In some embodiments, when the main device 160 is configured to perform power switching according to the driving signal S1 is having the first voltage level, the trigger circuit 180 is configured to turn on in response to a voltage level of the control terminal 160c, to modify a voltage level at the control terminal 140c, so that the voltage control circuit 140 is configured to output the driving signal S1 having a second voltage level. The second voltage level is less than the first voltage level.

Accordingly, at the moment when the main device 160 is turned on in response to the driving signal S1, the trigger circuit 180 may turn on in response to the voltage level of the control terminal 160c so as to pull low the voltage level at the control terminal 140c. At this time, the voltage control circuit 140 may decrease the voltage level of the driving signal S1 (e.g., from first voltage level to the second voltage level). Therefore, the main device 160 may perform power switching in a second state, and be protected from damage due to abnormal states (e.g., the abnormal large voltage or the large current). In summary, the trigger circuit 180 causes the voltage level of the driving signal S1 to have a "two-stage" change. Thus, in the present disclosure, the main device 160 is prevented from being damaged by abnormal states such as gate voltage spike without affecting the driving speed of the main device 160.

In some embodiments, the trigger circuit 180 includes a first capacitance C1, a first switching unit T1 and a first resistance R1. The first capacitance C1 is electrically connected to the control terminal 160c of the main device 160. The first switching unit T1 is electrically between the control terminal 140c of the voltage control circuit 140 and a reference terminal Nr (e.g. ground), and a control terminal of the first switching unit T1 is electrically connected to the first capacitance C1.

Figure 2:
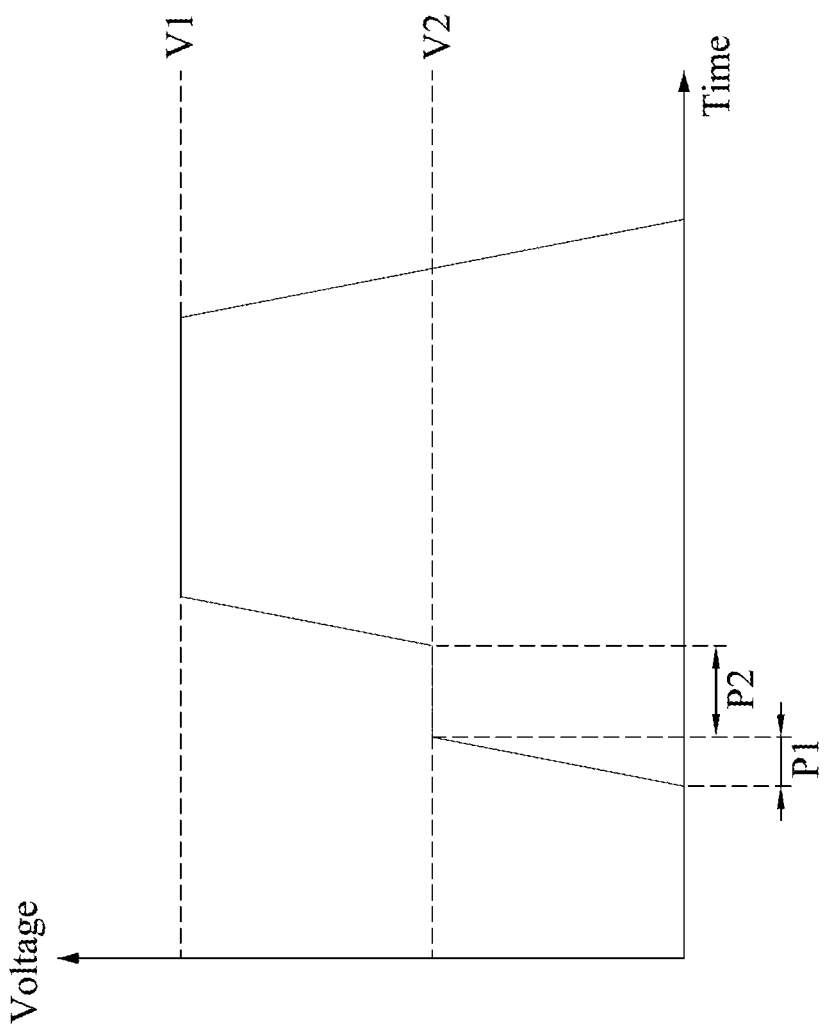
FIG. 2 is a voltage waveform diagram of the control terminal of main device in some embodiments of the present disclosure.

Referring to the FIG. 2, FIG. 2 is a waveform diagram of the voltage level change at the control terminal 160c. The horizontal axis represents the voltage value between the first resistor R1 and the first capacitor, and the vertical axis represents the voltage value of control terminal 160c. When the main device 160 is turned on in response to the first voltage level of the driving signal S1, the first capacitor begins to be charged, and the control terminal of the first switching unit T1 conducts to the control terminal 160c. In a first charging period P1, when the voltage level between the first resistor R1 and the first capacitance C1 reaches to the threshold voltage of the first switching unit T1, the first switching unit T1 will be turned on according to the voltage level of the control terminal 160c. At this time, since the control terminal 140c is pulled low to the reference terminal Nr, the voltage level of the driving signal S1 outputted by the voltage control circuit 140 may be controlled into the second voltage level V2.

After a second charging period P2, the capacitor C1 is fully charged, the first switching unit T1 is turned off. At this time, the control terminal 140c returns to a predetermined level, and the voltage level of the driving signal S1 outputted by the voltage control circuit 140 may be controlled into the first voltage level V1. Through the foregoing features, the problem that the main device 160 is damaged due to the voltage spike of the driving signal S1 can be avoided when the voltage control circuit 140 is beginning to output the signal S1 having the first voltage level V1. The length of time of the first charging period P1 and the second charging period P2 depends on the first capacitance R1 and the first resistance C1.

The driving signal S1 is generated by the voltage control circuit 140 in response to the voltage level at the control terminal 140c of the voltage control circuit 140. The voltage control circuit 140 can use a variety of circuit structures. In some embodiments, the voltage control circuit 140 includes a voltage control switch 141. The a voltage control switch 141 includes a drain terminal, a source terminal and a gate terminal. The drain terminal is coupled to the input terminal 140a of the voltage control circuit 140. The source terminal is coupled to the output terminal 140b of the voltage control circuit 140. The gate terminal is coupled to the control terminal 140c of the voltage control circuit 140.

The voltage control circuit 140 is normally-on in response to a zero gate-source voltage at the control terminal 140c. The voltage control switch 141 may include a depletion type metal-oxide-semiconductor field-effect transistor (MOSFET) switching device to achieve the normally-on operation in response to the zero gate-source voltage at the reference terminal, but the present disclosure is not limited thereto. In some other embodiments, the voltage control switch 141 may include other suitable semiconductor devices having similar channel current to gate voltage characteristics to achieve the voltage control switch 141. Alternatively stated, the voltage control switch 141 may include a depletion type MOSFET switching device, an enhancement type MOSFET switching device, or any combination thereof.

In some embodiments, the voltage control circuit 140 further includes a clamping circuit 142. A first terminal 142a of the clamping circuit 142 is electrically connected to the gate terminal of the voltage control switch 140. A second terminal 142c of the clamping circuit 142 is electrically connected to a reference terminal Nr. A voltage across the first terminal 142a and the second terminal 142b of the clamping circuit 142 is clamped to a predetermined level. In some embodiments, the clamping circuit 142 comprises at least two Zener diodes Da, Db connected in series. The control terminal 140c is between two Zener diodes Da, Db. The threshold voltage of the voltage control circuit 140 is negative, and the voltage control circuit 140 is configured to be off on the condition that the gate-source voltage is smaller than the negative threshold voltage Vth. In some embodiments, the threshold voltage is the threshold voltage of the MOSFET switching device. For example, in some embodiments, the threshold voltage of the normally-on device is between −0.1 volts and −20 volts.

Accordingly, the voltage level of the driving signal S1 will be clamped by the voltage control circuit 140 in response to the threshold voltage of the voltage control circuit 140 on the condition that the voltage level of the original signal S0 is higher than a specific value. Alternatively stated, the voltage level of the original signal S0 is higher than the voltage level of the driving signal S1 since the voltage level of the driving signal S1 is clamped by the voltage control circuit 140.

Figure 3B:
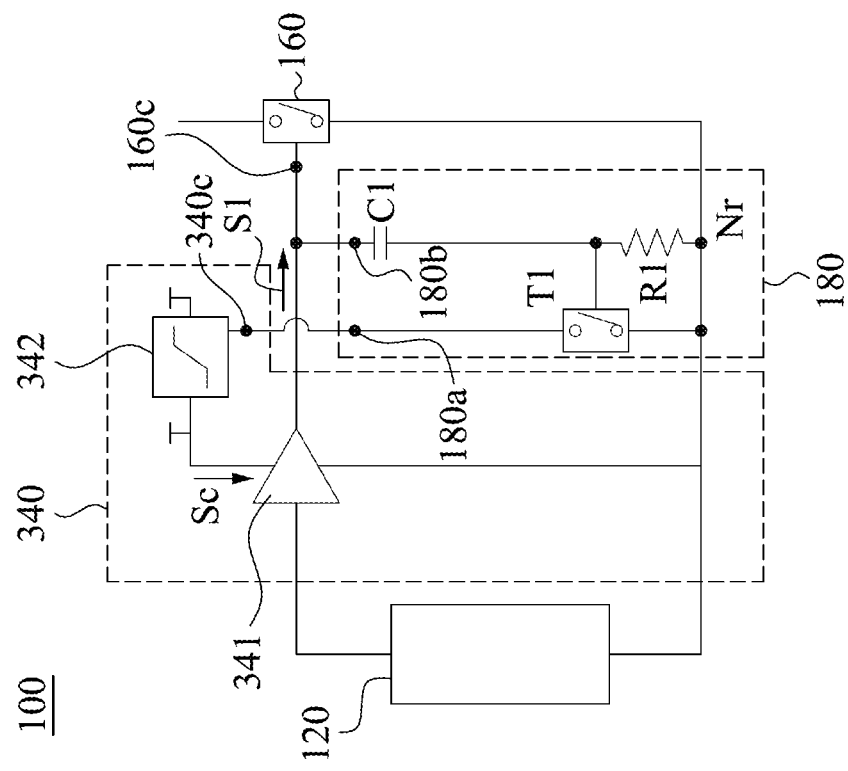
FIG. 3B is a schematic diagram of a conversion circuit in some embodiments of the present disclosure.
Figure 3A:
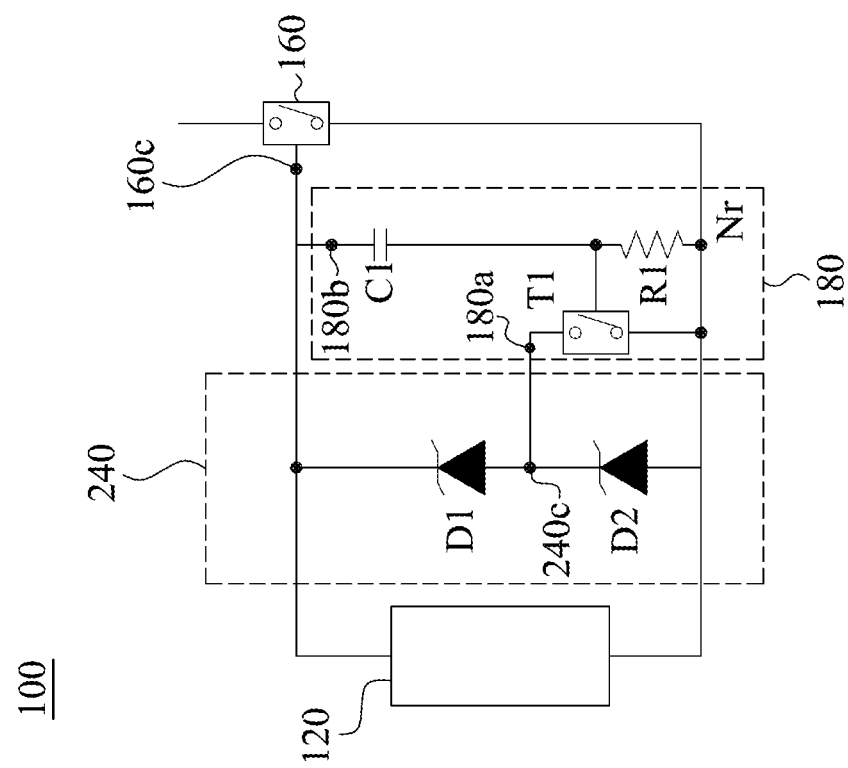
FIG. 3A is a schematic diagram of a conversion circuit in some embodiments of the present disclosure.

Reference is made to FIG. 3A and FIG. 3B. FIG. 3A and FIG. 3B are diagrams illustrating the voltage control circuit according to some other embodiments of the present disclosure. With respect to the embodiments of FIG. 3A and FIG. 3B, like elements in FIG. 1 are designated with the same reference numbers for ease of understanding. The specific operations of similar elements, which are already discussed in detail in the above paragraphs, are omitted herein for the sake of brevity, unless there is a need to introduce the co-operation relationship with the elements shown in FIG. 3A and FIG. 3B.

In some other embodiments, referring the FIG. 3A, the voltage control circuit 240 includes a clamping circuit. The clamping circuit includes multiple clamping unit D1, D2 connected in series, and the trigger circuit 180 is electrically connected to the control terminal 240*c* (i.e., a node between two of the clamping unit D1, D2). In some alternative embodiments, the clamping unit D1, D2 can be implemented by diodes or Zener diodes. In some other embodiments, the clamping circuit may be realized by multiple MOSFETs electrically coupled to each other. The gate terminal of one of the MOSFETs is electrically coupled to the source terminal or the drain terminal of another one of the MOSFETs. The number of the diode units or the MOSFETs may be adjusted according to actual needs and thus the present disclosure is not limited to examples shown in FIG. 3A. The original signal S0 is clamped by the clamping circuit of the voltage control circuit 240, and forms the driving signal S1. When the trigger circuit 180 is turned on, the control terminal 160*c* conducts to the reference terminal Nr, so the voltage level of the driving signal S1 will change accordingly.

In some other embodiments, referring the FIG. 3B, the voltage control circuit 340 includes a buffer 341 and a regulator circuit 342. The buffer 341 is electrically connected to the control terminal 160*c*. The regulator circuit 342 is electrically connected to the buffer 341. A control terminal of the regulator circuit 342 as the control terminal 340*c* of the voltage control circuit 340, and is electrically connected to the trigger circuit 180. The regulator circuit 342 is output a control voltage Sc to a positive control terminal of the buffer 341 to control the voltage level of the driving signal S1 outputted by the buffer 341. When the trigger circuit 180 is turned on, the control terminal of the regulator circuit 342 conducts to the reference Nr, so the voltage level of the control terminal of the regulator circuit 342 is decreased. At this time, the voltage level of the control voltage Sc is modified in response to a voltage level of the control terminal of the regulator circuit 342. Since the person in the art can understand the operation of the regulator circuit 342, it is not explained here.

In addition, referring to FIG. 1, in some embodiments, the driving signal generator 120 includes a logic circuit 122 and a driver buffer 124, and is configured to receive an input voltage VDD from a voltage source and generate an original signal S0. Specifically, the input voltage VDD is provided to the logic circuit 122 and the driver buffer 124 to supply the required power. In some embodiments, the logic circuit 122 is configured to generate the original signal S0 according to a pulse-width modulation (PWM) signal PWM.

For example, as shown in FIG. 1, the logic circuit 122 may include a Schmitt trigger ST1, an Under-Voltage Lockout (UVLO) circuit UVLO1, and an AND gate AND1. The Schmitt trigger is ST1 configured to receive the pulse-width modulation (PWM) signal PWM, and output a signal DSx, in which the value of the signal DSx retains the value until the pulse-width modulation signal PWM at the input terminal changes sufficiently to trigger a change.

The Under-Voltage Lockout (UVLO) circuit UVLO1 is configured to monitor the input voltage VDD and provide a protection signal PS1 on the condition that under voltage occurs. The AND gate AND1 is coupled to the Schmitt trigger ST1, and the Under-Voltage Lockout (UVLO) circuit UVLO1 at the input side, and perform an AND operation correspondingly to output the original signal S0 in response to the received signals. The original signal S0 is transmitted to the driver buffer 124 coupled to the logic circuit 122, and the driver buffer 124 is configured to output the original signal S0 via an output terminal. However, the structure of the driving signal generator 120 is not limited to this.

Figure 4:
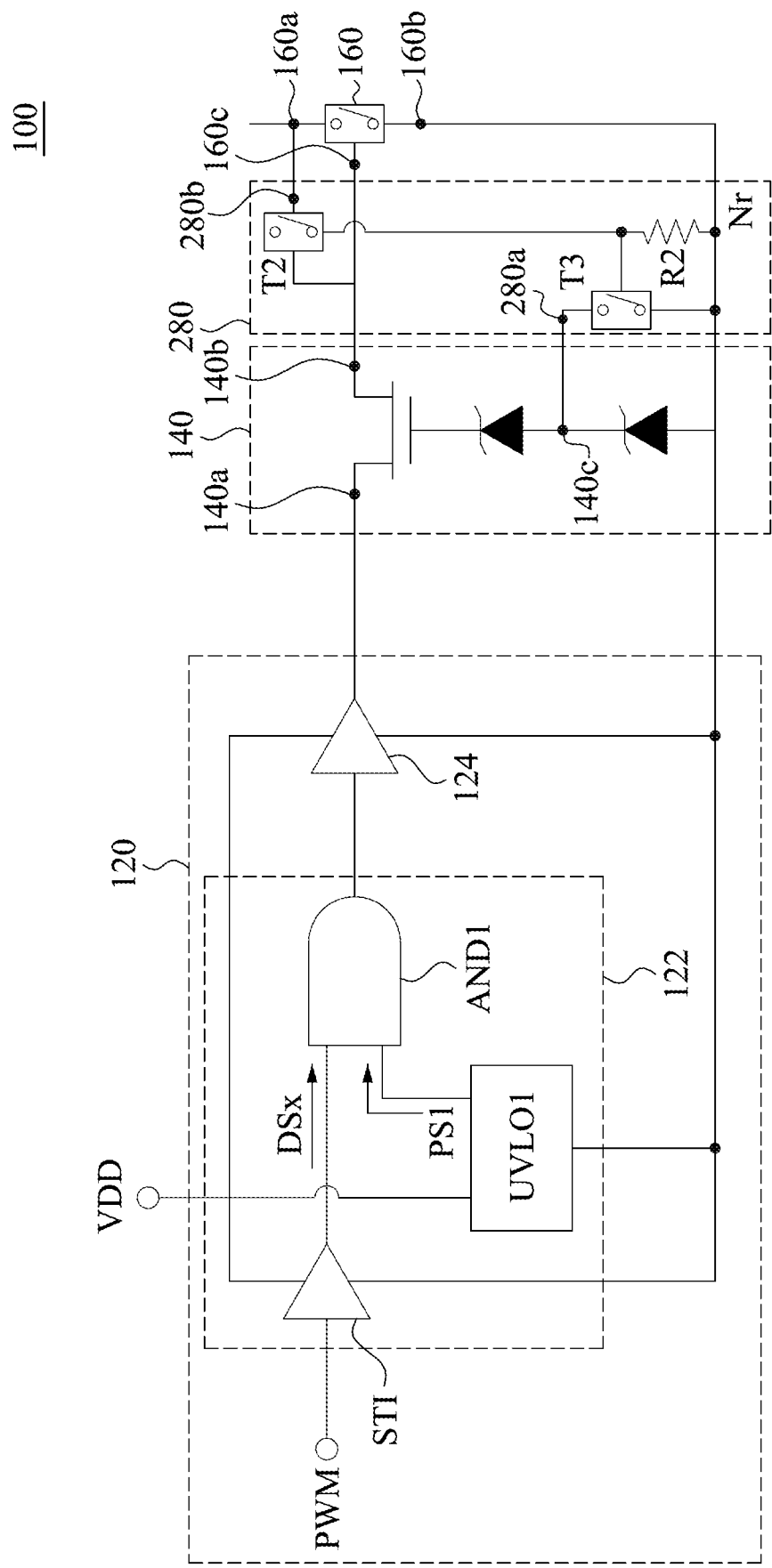
FIG. 4 is a schematic diagram of a conversion circuit in some embodiments of the present disclosure.

In the foregoing embodiment, the trigger circuit 180 is turned on in response to a voltage level of the control terminal 160*c*. However, in some other embodiments, the trigger circuit 180 may turn on in response to a voltage level of other terminals of the main device 160. Reference is made to FIG. 4. FIG. 4 is a diagram illustrating a conversion circuit 100 according to some embodiments of the present disclosure. With respect to the embodiments of FIG. 4, like elements in FIG. 1 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 4.

As shown in FIG. 4, in structural, the conversion circuit 100 includes the driving signal generator 120, the main device 160, the voltage control circuit 140 and a trigger circuit 280. The trigger circuit 280 is electrically connected between the first terminal 160*a* of the main device 160 and the control terminal 140*c* of the voltage control circuit 140. In some other embodiments, the trigger circuit 280 includes an output terminal 280*a* and a sense terminal 280*b*. The output terminal 280*a* of the trigger circuit 280 is electrically connected to the control terminal 140*c* of the voltage control circuit 140, and the sense terminal 280*b* of the trigger circuit 180 is electrically connected to the first terminal 160*a* of the main device 160.

When the main device 160 operates in the first state, and the first terminal 160*a* has a predetermined voltage level, the voltage control circuit 140 is configured to output the driving signal S1 having a first voltage level to the main device 160. The main device is configured to perform power switching according to the first voltage level of the driving signal S1. On the other hand, when the first terminal 160*a* of the main device 160 has an operation voltage level different from the predetermined voltage level, for example, the operation voltage level is much larger than the predetermined voltage level, or a large current through the main device 160, at this time, the trigger circuit 280 is configured to turn on in response to the operation voltage level of the first terminal 160*a*, to modify a voltage level at the control terminal 140*c* so that the voltage control circuit 140 is configured to output the driving signal S1 having a second voltage level, the second voltage level is less than the first voltage level.

Accordingly, in the situation that the main device 160 operates in the first state and performs power switching, if there is a large current, which exceeding a preset range, through the main device 160, the trigger circuit 280 may turn on in response to the voltage level of the first terminal 160*a* so as to pull low the voltage level at the control terminal

140c. At this time, the voltage control circuit 140 may decrease the voltage level of the driving signal S1 (e.g., from first voltage level to the second voltage level). Therefore, the main device 160 may perform power switching in a second state, and be protected from damage due to the gate voltage spike or the abnormal large current. Same as the previous embodiment, the trigger circuit 280 causes the voltage level of the driving signal S1 to have a "two-stage" change. That is, the voltage level of the driving signal S1 maintains to the second voltage level until the first terminal 160a return to the predetermined voltage level and the trigger circuit 280 is turned off accordingly.

Referring to the FIG. 4, in some embodiments, the trigger circuit 280 includes a second switching unit T2, a third switching unit T3, and a second resistance R2. The second switching unit T2 is electrically connected between the first terminal 160a and the reference terminal Nr. A control terminal of the second switching unit T2 is electrically connected to the output terminal 140b. The third switching unit T3 is electrically connected between the control terminal of the voltage control circuit 140c and the reference terminal Nr. A control terminal of the third switching unit T3 is electrically connected to the second switching unit T2. In some embodiments, the second switching unit T2 is further electrically connected to the reference terminal Nr through the second resistance R2. The control terminal of the third switching unit T3 is further electrically connected to the reference terminal Nr through the second resistance R2.

Since the voltage across the second switching unit T2 is same as the main device 160, the main device 160 and the second switching unit T2 may turn on and turn off synchronously. When the first terminal 160a has an operation voltage level different from the predetermined voltage level, the third switching unit T3 may turn on to decrease the voltage level of the control terminal 140c of the voltage control circuit 140. Then, the voltage level of the driving signal S1 may be modified to the second voltage level, and the main device 160 is protected from damage due to the large current.

Figure 5B:
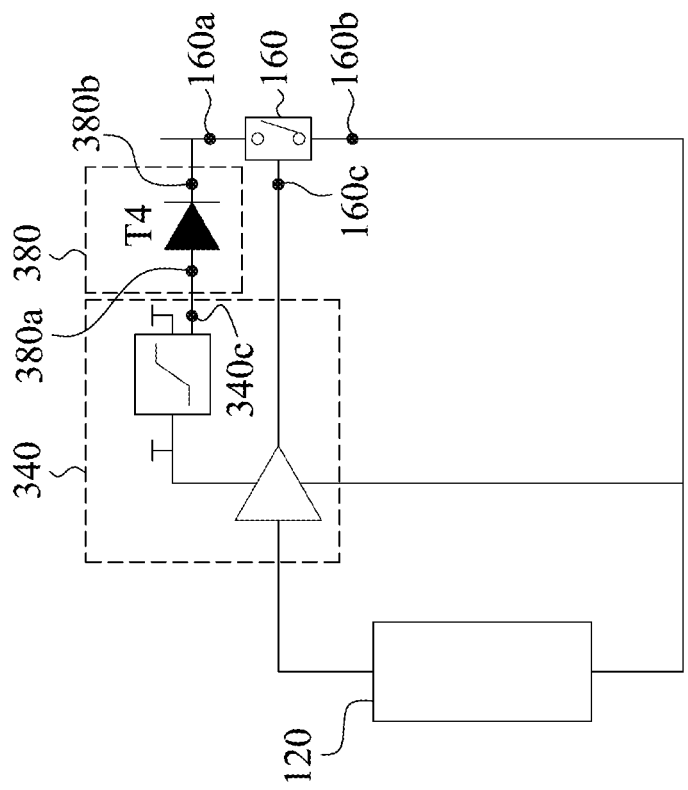
FIG. 5B is a schematic diagram of a conversion circuit in some embodiments of the present disclosure.
Figure 5A:
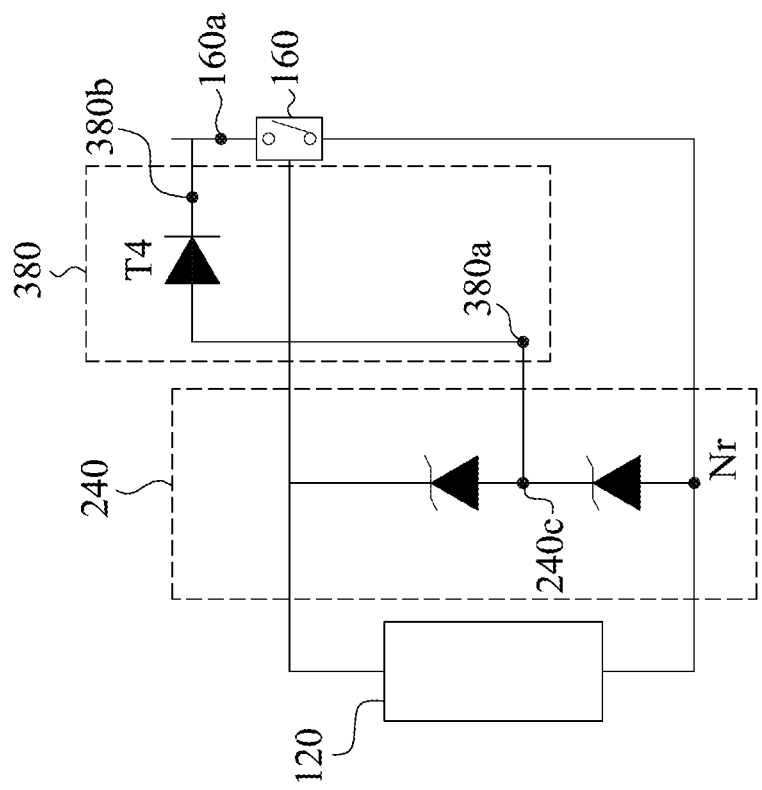
FIG. 5A is a schematic diagram of a conversion circuit in some embodiments of the present disclosure.

With respect to the embodiments of FIG. 5A-5B, like elements in FIG. 1 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 5A-5B. Referring to FIG. 5A, in other some embodiments, the trigger circuit 380 includes an output terminal 380a and a sense terminal 380b. The output terminal 380a of the trigger circuit 380 is electrically connected to the control terminal 240c of the voltage control circuit 240, and the sense terminal 380b of the trigger circuit 380 is electrically connected to the first terminal 160a of the main device 160.

The trigger circuit 380 includes a rectifier T4. The rectifier T4 is electrically connected between the first terminal 160a of the main device 160 and the control terminal 240c of the voltage control circuit 240. When a voltage across the rectifier T4 is larger than a forward voltage, the rectifier T4 is configured to turn on. For example, in the situation that the main device 160 is inverse turned on, if the current through the main device 160 become larger so as to the first terminal 160a has an operation voltage level different from the predetermined voltage level, the rectifier T4 may turn on to modify (e.g., decrease) the voltage level of the control terminal 240c. The rectifier T4 may be a diode, a rectifying element or a single throw switch, but not limited to this.

Referring to FIG. 5B, the trigger circuit 380 can be applied to the mentioned voltage control circuit 340. Similarly, in the embodiments shown in FIGS. 4, 5A, and 5B, the trigger circuit 280, 380 can be applied to the voltage control circuit 140, the voltage control circuit 240 or the voltage control circuit 340. Alternatively stated, the voltage control circuit 140 shown in FIG. 4 (or the voltage control circuit 240, 340 as shown in FIG. 5A-B) is merely one example of various embodiments of the present disclosure and not meant to limit the circuit structure of the voltage control circuit. The voltage control circuit in the conversion circuit can be implemented by the other circuit structure, such as the voltage control circuit 140, 240, 340 shown in FIG. 4-FIG. 5B.

Figure 6B:
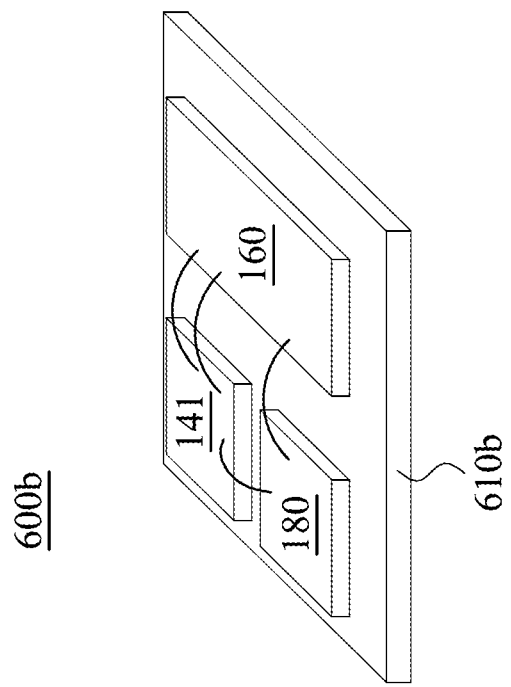
FIG. 6A-FIG. 6B are diagrams illustrating integration of the voltage control circuit, the main device and a trigger circuit according to some embodiments of the present disclosure.
Figure 6A:
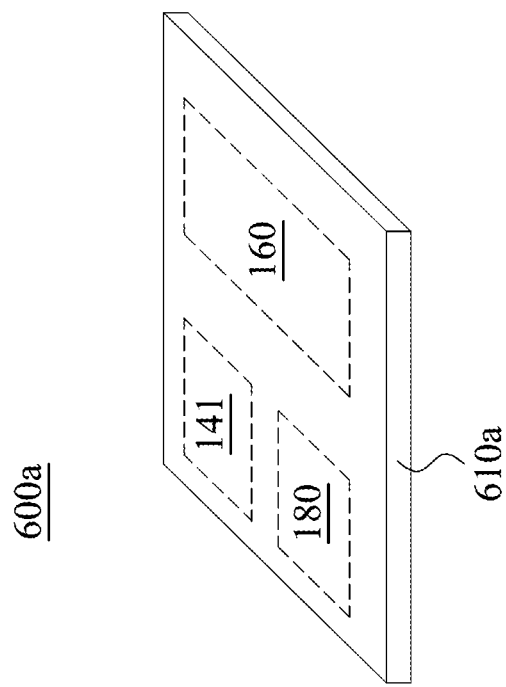

Reference is made to FIG. 6A-FIG. 6B. FIG. 6A-FIG. 6B are diagrams illustrating integration of the voltage control circuit 140, the main device 160 and the trigger circuit 180 according to some embodiments of the present disclosure.

Corresponding to the embodiments shown in FIG. 1, as shown in FIG. 6A, in some embodiments, the normally-on voltage control switch 141, the main device 160 and the trigger circuit 180 are integrated or packaged together with System on Chip (SoC) on a substrate 610a to form a chip 600a. As shown in FIG. 6B, in some embodiments, the normally-on voltage control switch 141, the main device 160 and the trigger circuit 180 are integrated or packaged together with System in Package (SiP) on a substrate 610b to form a package 600b. In various embodiments, SiP dies may be stacked vertically or tiled horizontally and internally connected by wires that are bonded to the package.

In other words, in various embodiments, the voltage control circuit 140, the main device 160 and the trigger circuit 180 may be integrated or packaged together with System in Package, System on Chip, three-dimensional integrated circuit (3D IC), etc.

Figure 7B:
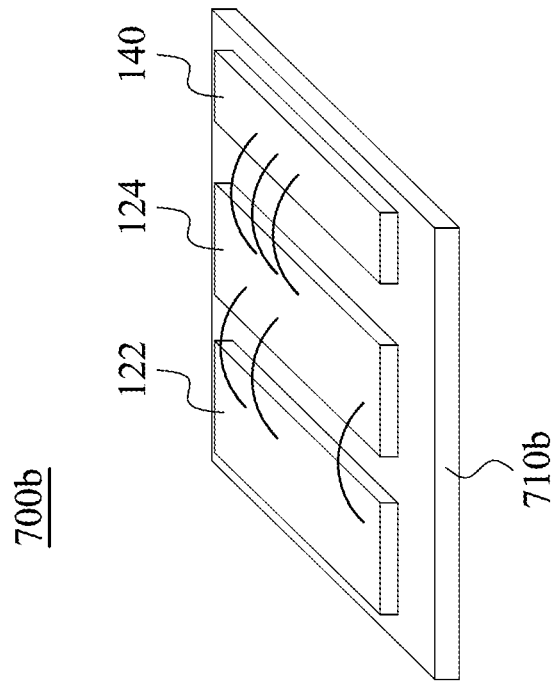
FIG. 7A and FIG. 7B are diagrams illustrating integration of the driving signal generator and the voltage control circuit according to some embodiments of the present disclosure.
Figure 7A:
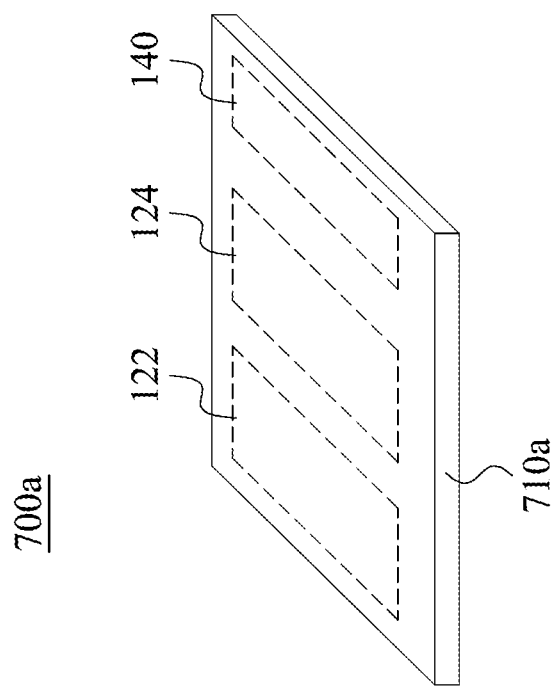

Reference is made to FIG. 7A and FIG. 7B. FIG. 7A and FIG. 7B are diagrams illustrating integration of the driving signal generator 120 and the voltage control circuit 140 according to some embodiments of the present disclosure.

Corresponding to the embodiments shown in FIG. 1, as shown in FIG. 7A, in some embodiments, the logic circuit 122, the driver buffer 124, and the voltage control circuit 140 are integrated or packaged together with System on Chip (SoC) on a substrate 710a to form a chip 700a. As shown in FIG. 7B, in some embodiments, the logic circuit 122, the driver buffer 124, and the voltage control circuit 140 are integrated or packaged together with System in Package (SiP) on a substrate 710b to form a package 700b.

In other words, in various embodiments, similar to the integration applied to the voltage control circuit 140 and the main device 160, in some embodiments, the driving signal generator 120 and the voltage control circuit 140 may be integrated or packaged together with System in Package, System on Chip, 3D IC, etc.

In some other embodiments, the driving signal generator 120, the voltage control circuit 140, the main device 160 and the trigger circuit 180 may also be integrated or packaged together with System in Package, System on Chip, 3D IC, etc, and further explanation is omitted herein for the sake of brevity.

In addition, the elements in the above embodiments may be implemented by various digital or analog circuits, and may also be implemented by different integrated circuit chips. Each element may also be integrated in a single chip. It is noted that, in an actual implementation, the circuits may be realized by a microcontroller unit (MCU), or by be realized in various ways such as by a digital signal processor (DSP), a field-programmable gate array (FPGA), etc. The switches and transistors may be realized by proper devices. For example, the switches may be implemented by power semiconductor devices including but not limited to Insulated Gate Bipolar Transistors (IGBTs), bipolar junction transistors (BJTs), SiC metal-oxide-semiconductor field-effect transistors (MOSFET), or mechanical switches, such as various types of relays. The normally-on switching devices may be GaN transistors or semiconductors devices with similar I-V characteristics. Transformer, diodes, resistors, capacitor units and/or inductors units may be realized by suitable electronic elements. The above list is merely exemplary and is not meant to be limitations of the present disclosure.

The elements, method steps, or technical features in the foregoing embodiments may be combined with each other, and are not limited to the order of the specification description or the order of the drawings in the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A conversion circuit, comprising:
   a main device comprising a control terminal;
   a voltage control circuit comprising an output terminal and a control terminal, the output terminal of the voltage control circuit electrically connected to the control terminal of the main device, wherein the voltage control circuit is configured to output a driving signal having a first voltage level to the main device; and
   a trigger circuit comprising an output terminal and a sense terminal, wherein the output terminal of the trigger circuit is electrically connected to the control terminal of the voltage control circuit, the sense terminal of the trigger circuit is electrically connected to the main device;
   wherein the main device further comprises a first terminal electrically connected to the sense terminal of the trigger circuit, when the first terminal of the main device has a predetermined voltage level, the voltage control circuit is configured to output the driving signal having the first voltage level to the main device, and the main device is configured to perform power switching according to the first voltage level of the driving signal;
   when the first terminal of the main device has an operation voltage level different from the predetermined voltage level, the trigger circuit is configured to turn on in response to the operation voltage level of the first terminal of the main device, to modify a voltage level at the control terminal of the voltage control circuit so that the voltage control circuit is configured to output the driving signal having a second voltage level.

2. The conversion circuit of claim 1, wherein a second terminal of the main device is electrically connected to a reference terminal, and the trigger circuit comprises:
   a second switching unit electrically connected between the first terminal of the main device and the reference terminal, and a control terminal of the second switching unit is electrically connected to the output terminal of the voltage control circuit; and
   a third switching unit electrically connected between the control terminal of the voltage control circuit and the reference terminal, and a control terminal of the third switching unit is electrically connected to the second switching unit.

3. The conversion circuit of claim 1, wherein the voltage control circuit comprises:
   a voltage control switch comprising:
   a drain terminal coupled to an input terminal of the voltage control circuit;
   a source terminal coupled to the output terminal of the voltage control circuit;
   a gate terminal coupled to the control terminal of the voltage control circuit; and
   a clamping circuit, comprising:
   a first terminal electrically connected to the gate terminal of the voltage control switch; and
   a second terminal electrically connected to a reference terminal, wherein a voltage across the first terminal and the second terminal of the clamping circuit is clamped to a predetermined level.

4. The conversion circuit of claim 1, wherein the voltage control circuit comprises a clamping circuit.

5. The conversion circuit of claim 4, wherein the clamping circuit comprises a clamping unit connected in series, and the trigger circuit is electrically connected between two of the clamping unit.

6. The conversion circuit of claim 1, wherein the main device comprises a GaN switching device, a MOSFET switching device, an IGBT switching device, a BJT switching device, a SiC switching device, a relay switching device, or any combination thereof.

7. The conversion circuit of claim 1, wherein the voltage control circuit, the main device and the switching circuit are integrated or packaged together with system in package, system on chip, or 3D IC.

8. A conversion circuit, comprising:
   a main device comprising a control terminal;
   a voltage control circuit comprising an output terminal and a control terminal, the output terminal of the voltage control circuit electrically connected to the control terminal of the main device, wherein the voltage control circuit is configured to output a driving signal having a first voltage level to the main device; and
   a trigger circuit comprising an output terminal and a sense terminal, wherein the output terminal of the trigger circuit is electrically connected to the control terminal of the voltage control circuit, the sense terminal of the trigger circuit is electrically connected to the main device;
   wherein the driving signal is generated by the voltage control circuit in response to the voltage level at the control terminal of the voltage control circuit, and the voltage control circuit comprises:
   a voltage control switch comprising:
   a drain terminal coupled to an input terminal of the voltage control circuit;
   a source terminal coupled to the output terminal of the voltage control circuit;
   a gate terminal coupled to the control terminal of the voltage control circuit; and
   a clamping circuit, comprising:
   a first terminal electrically connected to the gate terminal of the voltage control switch; and
   a second terminal electrically connected to a reference terminal, wherein a voltage across the first terminal and the second terminal of the clamping circuit is clamped to a predetermined level.

* * * * *